(12) United States Patent
Hidaka et al.

(10) Patent No.: US 12,163,746 B2
(45) Date of Patent: Dec. 10, 2024

(54) HEATSINK AND COOLING DEVICE

(71) Applicants: NIDEC CORPORATION, Kyoto (JP); KABUSHIKI KAISHA TOYOTA JIDOSHOKKI, Aichi (JP)

(72) Inventors: Hidehiko Hidaka, Kyoto (JP); Shigeyuki Moriya, Kyoto (JP); Takashi Takeuchi, Kariya (JP); Masahiro Ichigo, Kariya (JP); Toshiaki Ito, Kariya (JP); Yoshiaki Oshita, Kariya (JP)

(73) Assignees: NIDEC CORPORATION, Kyoto (JP); KABUSHIKI KAISHA TOYOTA JIDOSHOKKI, Aichi (JP)

( * ) Notice: Subject to any disclaimer, the term of this patent is extended or adjusted under 35 U.S.C. 154(b) by 267 days.

(21) Appl. No.: 17/788,742

(22) PCT Filed: Dec. 21, 2020

(86) PCT No.: PCT/JP2020/047734
§ 371 (c)(1),
(2) Date: Jun. 24, 2022

(87) PCT Pub. No.: WO2021/132177
PCT Pub. Date: Jul. 1, 2021

(65) Prior Publication Data
US 2023/0042270 A1 Feb. 9, 2023

(30) Foreign Application Priority Data
Dec. 26, 2019 (JP) .................................. 2019-236470

(51) Int. Cl.
*H01L 23/46* (2006.01)
*F28F 3/04* (2006.01)
(Continued)

(52) U.S. Cl.
CPC ................ *F28F 3/04* (2013.01); *F28F 13/06* (2013.01); *H01L 23/467* (2013.01); *F28F 2250/08* (2013.01)

(58) Field of Classification Search
CPC .............. H01L 23/467; H05K 7/20154; H05K 7/20163
See application file for complete search history.

(56) References Cited

U.S. PATENT DOCUMENTS

2003/0007327 A1   1/2003   Fujiwara

FOREIGN PATENT DOCUMENTS

| JP | 200323281 A | | 1/2003 |
| JP | 2003037383 A | * | 2/2003 |
| JP | 2003218295 A | | 7/2003 |

* cited by examiner

*Primary Examiner* — Eric S Ruppert
(74) *Attorney, Agent, or Firm* — HAUPTMAN HAM, LLP

(57) ABSTRACT

A heatsink is used with a fluid flow generator that rotates about a central axis extending vertically. The heatsink includes a main body section having a top surface facing the fluid flow generator in a vertical direction, and fins that extend upward from the top surface so as to define a plurality of flow passages. The plurality of flow passages form a plurality of fluid paths, each of which has an inlet for the fluid discharged from the fluid flow generator to flow in, and an outlet for discharging to outside the fluid that has entered through the inlet. At least one of the plurality of fluid paths has a first branch section for branching from a first fluid path on downstream of the inlet, and a first joining section for joining a second fluid path having another inlet, on downstream of the first branch section.

11 Claims, 10 Drawing Sheets

(51) Int. Cl.
*F28F 13/06* (2006.01)
*H01L 23/467* (2006.01)

HEATSINK AND COOLING DEVICE

RELATED APPLICATIONS

The present application is National Phase of International Application Number PCT/JP2020/047734, filed Dec. 21, 2020, and claims priority based on Japanese Patent Application No. 2019-236470, filed Dec. 26, 2019.

TECHNICAL FIELD

The present invention relates to a heatsink and a cooling device.

BACKGROUND ART

Conventionally, there is known a cooling device including a heatsink that is thermally connected to a heat generating body, and an electric fan device that blows cooling air to the heatsink (see for example Patent Document 1).

The heatsink includes a heat receiving section that receives heat from a heat radiating body, a plurality of heat dissipation fins, and cooling air flow paths through which cooling air is blown. The cooling air flow paths are formed along the heat dissipation fins. The electric fan device includes a centrifugal impeller. The impeller sucks air and discharges the sucked air to the cooling air flow paths. The air flowing in the cooling air flow paths works as a main cooling medium that performs heat exchange with the heatsink so as to draw heat from the heat generating body. The air that is heated by the heat exchange with the heatsink is discharged outside from a downstream end of the cooling air flow paths.

LIST OF CITATIONS

Patent Literature

Patent Document 1: JP-A-2003-23281

SUMMARY OF THE INVENTION

Technical Problem

Now, if the number of the heat dissipation fins is increased, it is expected that a heat dissipation area is increased so that cooling capacity can be increased. However, if the number of the heat dissipation fins is simply increased so that the number of the cooling air flow paths is increased, air flow may be deteriorated. Particularly in a cooling air flow path having a long length between an inlet and an outlet, if the heat dissipation fin is disposed in the middle of the air flow path for branching the air flow path so as to increase the number thereof, possibility of air flow stagnation is increased.

It is an object of the present invention to provide a technique that can increase the number of flow passages defined by fins so as to increase cooling efficiency while preventing stagnation of fluid flow.

Means for Solving the Problem

An exemplary heatsink of the present invention is used with a fluid flow generator that rotates about a central axis extending vertically to generate a flow of fluid. The heatsink includes a main body section having a top surface facing the fluid flow generator in a vertical direction, and fins that extend upward from the top surface so as to define a plurality of flow passages. The plurality of flow passages form a plurality of fluid paths, each of which has an inlet for the fluid discharged from the fluid flow generator to flow in, and an outlet for discharging to outside the fluid that has entered through the inlet. At least one of the plurality of fluid paths has a first branch section for branching from a first fluid path on downstream of the inlet, and a first joining section for joining a second fluid path having another inlet, on downstream of the first branch section.

In addition, an exemplary heatsink of the present invention is used with a fluid flow generator that rotates about a central axis extending vertically to generate a flow of fluid. The heatsink includes a main body section having a top surface facing the fluid flow generator in a vertical direction, and fins that extend upward from the top surface so as to define a plurality of flow passages. Four regions defined by an X axis and a Y axis, which cross each other at an intersection between the central axis and the top surface and extend in an extending direction of the top surface, are referred to as a first region, a second region, a third region, and a fourth region, in order in a direction opposite to a rotation direction of the fluid flow generator. The plurality of flow passages form a plurality of fluid paths, each of which has an inlet for the fluid discharged from the fluid flow generator to flow in, and an outlet disposed in the first region so as to discharge to outside the fluid that has entered through the inlet. Among the plurality of fluid paths, a long distance path that passes through the second region and the third region between the inlet and the outlet is formed using a long distance flow passage extending from the second region to the third region. In a plan view from above, a plurality of the long distance flow passages are arranged in a direction separating from the intersection. Among the plurality of long distance flow passages, an outermost long distance flow passage positioned at a farthest position from the intersection in the second region has a joining section for joining another flow passage in at least one of the second region and the third region.

An exemplary cooling device of the present invention includes the heatsink configured as described above and the fluid flow generator.

Advantageous Effects of the Invention

According to the exemplary present invention, it is possible to increase the number of flow passages defined by fins so as to increase cooling efficiency while preventing stagnation of fluid flow.

DESCRIPTION OF EMBODIMENTS

Hereinafter, an exemplary embodiment of the present invention will be described in detail with reference to the drawings. Note that in this specification, a direction parallel to a central axis C illustrated in FIG. 3 of a fluid flow generator 2, which is used with a heatsink 1, is referred to as an "axial direction", a direction perpendicular to the central axis C is referred to as a "radial direction", and a direction along a circle centered at the central axis C is referred to as a "circumferential direction".

Further in this specification, the axial direction is a vertical direction, and a side on which the fluid flow generator 2 is disposed to the heatsink 1 is an upper side, for describing shapes and positional relationships of individual sections. However, this definition of the vertical direction is not intended to limit postures of the heatsink and the cooling device according to the present invention when they are used.

Figure 2:
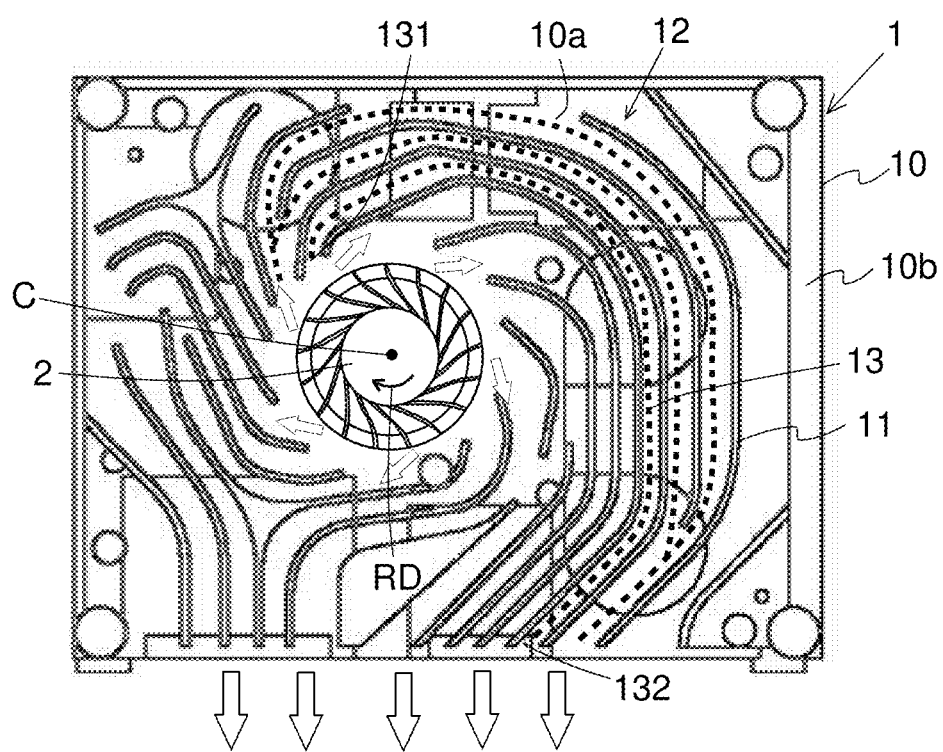
FIG. 2 is a view after removing a cover from FIG. 1.

In addition, "upstream" and "downstream" in this specification mean, as a rule, upstream and downstream in a flow direction of the fluid from an inlet 131 to an outlet 132 illustrated in FIG. 2 when the fluid flow generator 2 is rotated.

<1. Cooling Device>

Figure 1:
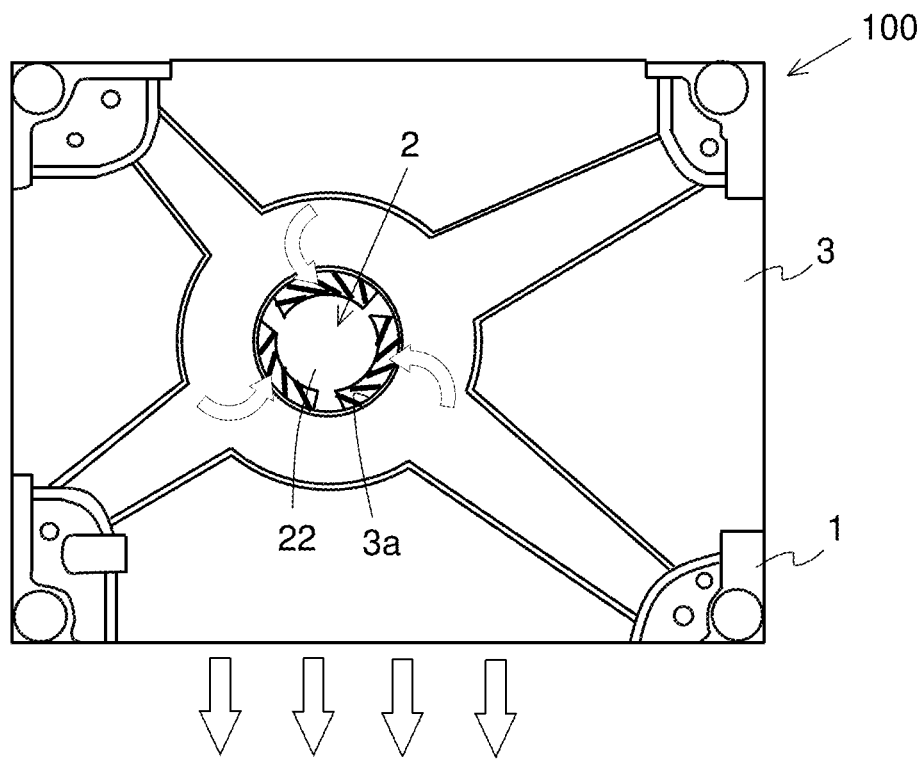
FIG. 1 is a plan view of a cooling device according to an embodiment of the present invention.

FIG. 1 is a plan view of a cooling device 100 according to the embodiment of the present invention. FIG. 1 illustrates the cooling device 100 viewed from above. As illustrated in FIG. 1, the cooling device 100 includes the heatsink 1 and the fluid flow generator 2. The cooling device 100 further includes a cover 3.

The heatsink 1 is used with the fluid flow generator 2. The heatsink 1 is a heat dissipation member made of a metallic material having good thermal conductivity, such as aluminum, copper, aluminum alloy, or copper alloy. FIG. 2 is a view after removing the cover 3 from FIG. 1. In FIG. 2, the fluid flow generator 2 is schematically illustrated. As illustrated in FIG. 2, the heatsink 1 includes a main body section 10 and fins 11. The main body section 10 and the fins 11 are the same member.

The main body section 10 has a rectangular shape in a plan view from above. However, the main body section 10 may have any shape other than the rectangular shape, and may have a polygonal shape or the like other than the rectangular shape, for example. The main body section 10 has a top surface 10a facing the fluid flow generator 2 in the vertical direction. The top surface 10a extends in a direction perpendicular to the vertical direction. The top surface 10a may be a flat surface, or may be an uneven surface. A peripheral wall 10b is disposed to extend upward along the peripheral edge of the top surface 10a except one side among four sides.

The fins 11 extend upward from the top surface 10a. A plurality of fins 11 are disposed on the top surface 10a. In a plan view from above, the fins 11 have various shapes. For instance, in a plan view from above, a certain fin 11 has a linear shape, another fin 11 has a curved shape such as an arcuate shape, and still another fin 11 has a shape including a linear part and a curved part. Note that the fin 11 may have a spot-like shape in a plan view from above. The spot-like fin may have a cylindrical shape, a prismatic shape, a spindle shape, or the like, for example.

The fins 11 define a plurality of flow passages 12. The flow passage 12 is a way for fluid to pass. The flow passage 12 is formed between two fins 11. In addition, the flow passage 12 is formed between the fin 11 and the peripheral wall 10b. In this embodiment, the flow passage 12 has a groove shape. The fluid flowing in the flow passage 12 contacts with the fins 11 so as to perform heat exchange with them. Specifically, the fluid draws heat from the fins 11. In other words, the fin 11 is a heat dissipation fin.

In FIG. 2, thick broken lines indicate a plurality of fluid paths 13 obtained from the plurality of flow passages 12, in a schematic manner Note that FIG. 2 illustrates only some of the plurality of fluid paths 13 obtained from the plurality of flow passages 12. Each of the plurality of fluid paths 13 includes an inlet 131 and an outlet 132. The fluid path 13 is a way for fluid to flow from one inlet 131 to one outlet 132.

The inlet 131 is a place for the fluid discharged from the fluid flow generator 2 to flow in. The outlet 132 is a place for discharging to outside the fluid that has entered through the inlet 131. Here, the outside means outside of the heatsink 1. In other words, the fluid path 13 is a way for the fluid discharged from the fluid flow generator 2 to flow to the outside of the heatsink 1. The fluid passing in each fluid path 13 performs heat exchange with the fins 11.

As illustrated in FIG. 2, the fluid flow generator 2 generates a fluid flow by rotating about the central axis C extending vertically. Note that white arrows illustrated in FIG. 2 indicate fluid flows. In the fluid flow generator 2, the direction in which the fluid flows in is different from the direction in which the fluid is discharged. In this embodiment, the direction in which the fluid flows in is the vertical direction, while the direction in which the fluid is discharged is a direction perpendicular to the vertical direction. Further in this embodiment, a rotation direction RD of the fluid flow generator 2 that rotates around the central axis C is a clockwise direction. However, the rotation direction of the fluid flow generator 2 may be a counterclockwise direction. If the rotation direction of the fluid flow generator 2 is the counterclockwise direction, the layout and shapes of the fins 11 are modified.

Note that the fluid is a gas or a liquid, for example. The gas is air, for example. The liquid is water or liquid coolant, for example. In this embodiment, the fluid is air.

In addition, the fluid flow generator 2 is a fan or a pump, for example. In this embodiment, the fluid flow generator 2 is a centrifugal fan that intakes air from the top and discharges the air in a direction perpendicular to the vertical direction. With this structure, when the fluid flow generator 2 is driven, air is taken from the outside into the cooling device 100, and the intake air passes through the fluid paths 13 while performing heat exchange, and is discharged to the outside. With this air flow, an object to be cooled can be efficiently cooled.

Figure 3:
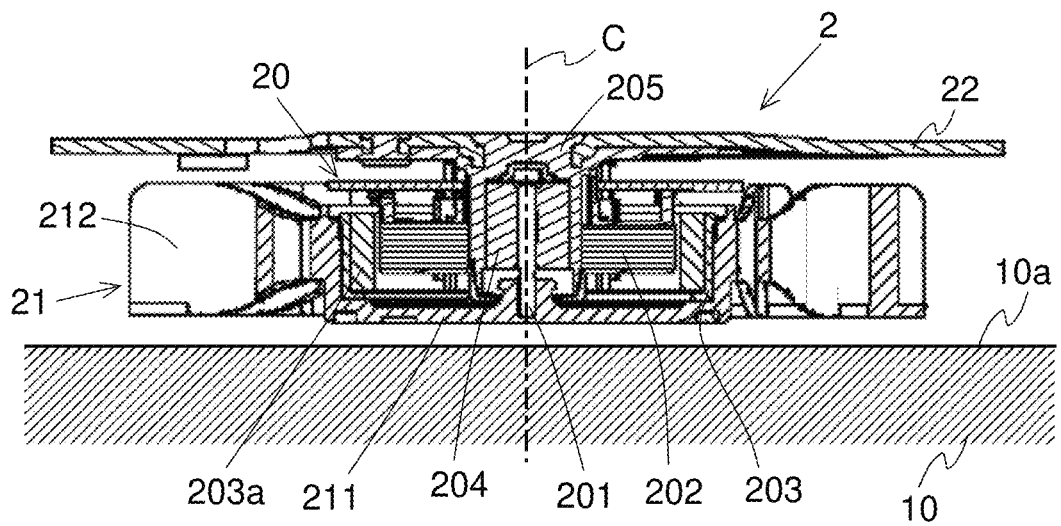
FIG. 3 is a vertical cross-sectional view of a fluid flow generator according to the embodiment of the present invention.

FIG. 3 is a vertical cross-sectional view of the fluid flow generator 2 according to the embodiment of the present invention. FIG. 3 also illustrates a part of the main body section 10 of the heatsink 1 for easy understanding. As illustrated in FIG. 3, the fluid flow generator 2 includes a motor 20, an impeller 21, and a support part 22.

The motor 20 includes a shaft 201, a stator 202, and a rotor 203. The shaft 201 extends vertically along the central axis C. The shaft 201 is supported in a rotatable manner by a bearing 204 disposed outside of the shaft 201 in the radial direction. The bearing 204 is housed and held in a bearing holder 205 having a capped cylindrical shape, which is supported by the support part 22. Note that the bearing 204 is a sleeve bearing in this embodiment, but it can be other type such as a ball bearing.

The stator 202 has an annular shape around the central axis C. The stator 202 is disposed outside of the bearing holder 205 in the radial direction and is fixed to the same. The rotor 203 has a cylindrical shape whose axis is the central axis C. An annular magnet 203a is fixed to an inner surface of the rotor 203 in the radial direction. The magnet 203a is disposed outside the stator 202 in the radial direction with a space therebetween. When the stator 202 is supplied with a drive current, a rotation torque is generated between the magnet 203a and the stator 202. In this way, the rotor 203 rotates with respect to the stator 202.

The impeller 21 includes an impeller cup 211 and a plurality of vanes 212. The impeller cup 211 has a bottomed cylindrical shape whose axis is the central axis C, and is fixed to the shaft 201. The rotor 203 is fixed to an inner surface of the impeller cup 211 in the radial direction. Therefore, the impeller 21 rotates with rotation of the rotor 203.

Each vane 212 extends from an outer surface in the radial direction of the impeller cup 211, in a direction separating from the central axis C. The plurality of vanes 212 are arranged with spaces in the circumferential direction. Note that the direction separating from the central axis C may be parallel to the radial direction or may be inclined from the radial direction. When the vanes 212 rotate, air flow is generated.

The support part 22 that supports the motor 20 is fixed to the underside of the cover 3. Therefore in this embodiment, the fluid flow generator 2 is disposed with a space between it and the top surface 10a of the main body section 10 in the vertical direction. However, the support part 22 may be united with the cover 3. With this structure, the number of components can be decreased, and cost can be reduced. In addition, the support part 22 may be attached to the top surface 10a. In other words, the top surface 10a facing the fluid flow generator 2 in the vertical direction may be contacted with the same.

As illustrated in FIG. 1, the cover 3 covers the top surface 10a of the main body section 10 of the heatsink 1. The cover 3 is made of a metallic material having a good thermal conductivity such as iron or iron alloy. The cover 3 is secured to the main body section 10 of the heatsink 1 by means of screws, brazing, or other methods.

Near the center of the cover 3, a circular cover aperture 3a is formed so as to penetrate the same in the vertical direction. The fluid flow generator 2 attached to the underside of the cover 3 is exposed to the outside of the cooling device 100 through the cover aperture 3a. When the fluid flow generator 2 is driven, the fluid flows in from the outside of the cooling device 100 through the cover aperture 3a. In addition, when the fluid flow generator 2 is driven, the sucked-in fluid passes through the fluid paths 13 formed in the heatsink 1 and is discharged to the outside of the cooling device 100 through the part without the peripheral wall 10b.

Figure 4:
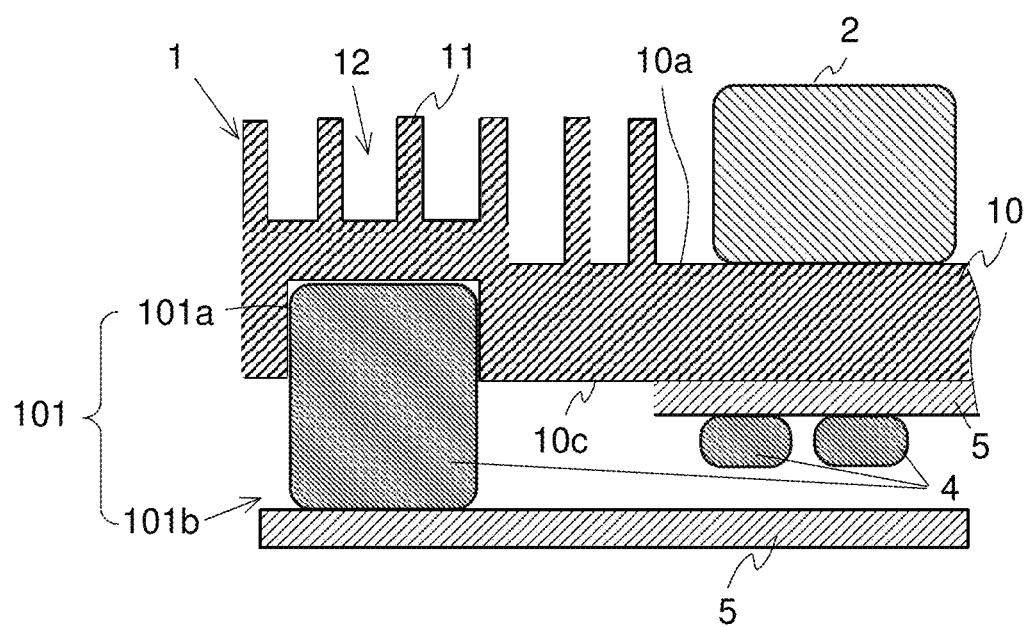
FIG. 4 is a schematic cross-sectional view of the cooling device according to the embodiment of the present invention.

FIG. 4 is a schematic cross-sectional view of the cooling device 100 according to the embodiment of the present invention. As illustrated in FIG. 4, the main body section 10 has a cooled body housing section 101 for housing a cooled body on an underside 10c. The cooled body is the object to be cooled, and in the example illustrated in FIG. 4, it corresponds to a heat generating body 4 and a substrate 5 on which the heat generating body 4 is mounted. As the heat generating body 4, there is a heat generating element such as a semiconductor chip or a transistor.

In this embodiment, the cooled body housing section 101 includes an element housing section 101a and a substrate housing section 101b. However, it may be configured to include only one of the element housing section 101a and the substrate housing section 101b. The element housing section 101a is a recess dented upward on the underside 10c of the main body section 10, so as to house at least a part of the heat generating element as the heat generating body 4. It is preferred that the heat generating body 4 housed in the element housing section 101a contacts with the main body section 10. Note that it is sufficient that the heat generating body 4 thermally contacts with the main body section 10, and there may be thermal grease between the heat generating body 4 and the main body section 10, for example. The substrate housing section 101b is a section for housing the substrate 5, and it is preferred that the substrate 5 housed in the substrate housing section 101b is thermally contacted with the main body section 10.

When the fluid flow generator 2 is driven, the fluid passing through the plurality of fluid paths 13 performs heat exchange with the heatsink 1 so as to draw heat from the cooled body. In this way, the cooled body is cooled. The fluid heated by heat exchange with the heatsink 1 passes through the outlet 132 of the fluid path 13 and is discharged outside of the cooling device 100. In this embodiment, a wide area of the heatsink 1 that is used with the fluid flow generator 2 can be cooled by the fluid, and hence the cooled body can be efficiently cooled. Further in this embodiment, as the cooled body housing section 101 for housing the cooled body is formed in the underside of the heatsink 1 whose wide area can be cooled, restrictions about the layout of the cooled body can be reduced.

<2. Details of Heatsink>
(2-1. Outline of Fluid Path)

Figure 5:
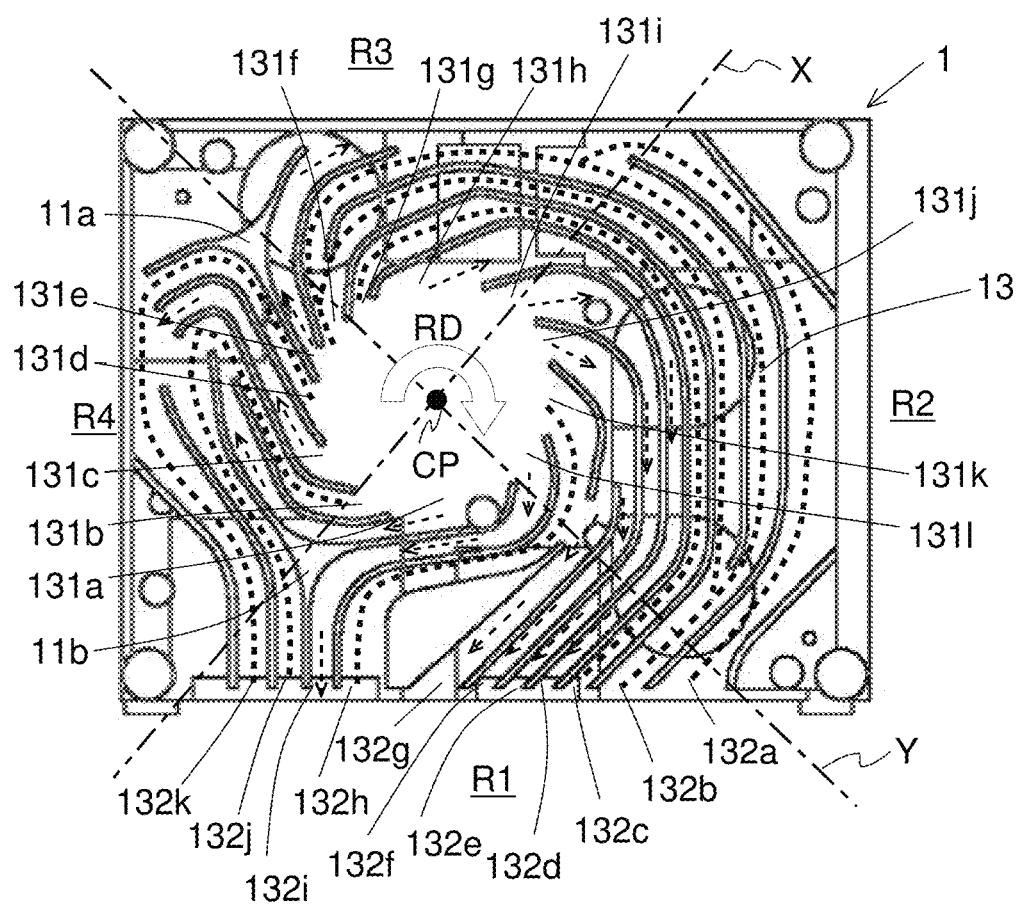
FIG. 5 is a plan view of a heatsink according to the embodiment of the present invention.

FIG. 5 is a plan view of the heatsink 1 according to the embodiment of the present invention. FIG. 5 illustrates the heatsink 1 viewed from above. Broken line arrows in FIG. 5 indicate fluid flows. In this embodiment, the fluid flow is air flow or wind. Also in FIG. 5, similarly to FIG. 2, some of the plurality of fluid paths 13 obtained from the plurality of flow passages 12 are schematically shown in thick broken lines. A white arrow RD in FIG. 5 indicates the rotation direction of the fluid flow generator 2.

In FIG. 5, four regions R1, R2, R3, and R4 defined by an X axis and a Y axis, which cross each other at an intersection CP between the central axis C and the top surface 10a and extend in an extending direction of the top surface 10a, are referred to as a first region R1, a second region R2, a third region R3, and a fourth region R4, in order in a direction opposite to the rotation direction RD of the fluid flow generator 2. The extending direction of the top surface 10a is a direction perpendicular to the vertical direction. The rotation direction RD is the clockwise direction, while the direction opposite to the rotation direction RD is the counterclockwise direction.

Note that in this embodiment, the X axis is orthogonal to the Y axis. However, the X axis may not be orthogonal to the Y axis. Further in this embodiment, the X axis and the Y axis do not equally divide the top surface 10a of the main body section 10 into four regions. However, the X axis and the Y axis may equally divide the top surface 10a of the main body section 10.

As illustrated in FIG. 5, in a plan view from above, the inlet 131 of each fluid path 13 is disposed in at least one of the four regions R1, R2, R3, and R4. Each inlet 131 may be disposed in only one of the four regions R1, R2, R3, and R4 or disposed over a plurality of regions.

In this embodiment, a first inlet 131a, a second inlet 131b, a third inlet 131c, a fourth inlet 131d, a fifth inlet 131e, a sixth inlet 131f, a seventh inlet 131g, an eighth inlet 131h, a ninth inlet 131i, a tenth inlet 131j, an eleventh inlet 131k, and a twelfth inlet 131l are disposed in order from the first region R1 in the rotation direction RD of the fluid flow generator 2.

The first inlet 131a and the second inlet 131b are disposed in the first region R1. The third inlet 131c, the fourth inlet 131d, the fifth inlet 131e, and the sixth inlet 131f are disposed in the fourth region R4. The seventh inlet 131g and the eighth inlet 131h are disposed in the third region R3. The ninth inlet 131i is disposed over the third region R3 and the second region R2. The tenth inlet 131j, the eleventh inlet 131k, and the twelfth inlet 131l are disposed in the second region R2.

As illustrated in FIG. 5, in a plan view from above, the outlet 132 of each fluid path 13 is disposed in the first region R1. Specifically, all the outlets 132 of the plurality of fluid paths 13 are disposed in the first region R1. In other words, in the heatsink 1 of this embodiment, the outlets 132 of the fluid paths 13 are disposed in a particular direction in a biased manner.

In this embodiment, in the first region R1, a first outlet 132a, a second outlet 132b, a third outlet 132c, a fourth outlet 132d, a fifth outlet 132e, a sixth outlet 132f, a seventh outlet 132g, an eighth outlet 132h, a ninth outlet 132i, a tenth outlet 132j, and an eleventh outlet 132k are disposed, in order from upstream to downstream of the rotation direction RD of the fluid flow generator 2.

Note that in this embodiment, only one fluid path 13 is obtained from one inlet 131 in one structure, and a plurality of fluid paths 13 are obtained from one inlet 131 in another structure, which are mixed. However, without limiting to these mixed structures, only one of the former and latter structures may be disposed, for example. In the former structure, the inlet 131 and the outlet 132 always have a one-to-one relationship. The latter structure may include a structure in which the plurality of fluid paths 13 share the same outlet 132, for example. In addition, the latter structure may include a structure in which the plurality of fluid paths 13 have different outlets 132.

Specific examples are given with reference to FIG. 5. For example, as to the seventh inlet 131g disposed in the third region R3, only one fluid path 13 from the seventh inlet 131g to the third outlet 132c is obtained. As to the sixth inlet 131f disposed in the fourth region R4, total three fluid paths 13 are obtained, which include the fluid path 13 from the sixth inlet 131f to the first outlet 132a, and the two fluid pats 13 from the sixth inlet 131f to the second outlet 132b.

Note that the first inlet 131a, the second inlet 131b, the third inlet 131c, the fourth inlet 131d, the fifth inlet 131e, the sixth inlet 131f, the tenth inlet 131j, and the eleventh inlet 131k are shared by a plurality of fluid paths 13. In addition, the first outlet 132a, the second outlet 132b, the seventh outlet 132g, the eighth outlet 132h, the tenth outlet 132j, and the eleventh outlet 132k are shared by a plurality of fluid paths 13.

Further in this embodiment, the fins 11 include Y-shaped fins 11a and 11b. As the Y-shaped fins 11a and 11b are disposed on the top surface 10a, stiffness of the heatsink 1 can be improved. In addition, using the Y-shaped fin 11a, 11b for constituting the flow passage 12, the fluid can be easily guided to different directions. Although two Y-shaped fins 11a and 11b are used in this embodiment, the number of the Y-shaped fins may not be two. The Y-shaped fin 11a, one of two Y-shaped fins, is disposed over the third region R3 and the fourth region R4. The Y-shaped fin 11b, the other of two Y-shaped fins, is disposed over the first region R1 and the fourth region R4.

As to the heatsink 1, in a plan view from above, in at least one of the fluid paths 13 having the inlet 131 in the fourth region R4, the fluid flow direction changes at an acute angle in the middle thereof. As illustrated in FIG. 5, in this embodiment, four inlets 131 including the third inlet 131c, the fourth inlet 131d, the fifth inlet 131e, and the sixth inlet 131f are disposed in the fourth region R4. Among the four inlets 131, the third inlet 131c is the inlet 131 of the fluid path 13, and the fourth inlet 131d is the inlet 131 of the fluid path 13, in both of which the fluid flow direction changes at an acute angle in the middle thereof.

The middle means a position or a region between the inlet 131 and the outlet 132. In other words, in at least one of the fluid paths 13 having the inlet 131 in the fourth region R4, the fluid flow direction changes at an acute angle on downstream of the inlet 131. In this embodiment, the fluid flow direction does not change at an acute angle at the inlet 131. In addition, that the fluid flow direction changes at an acute angle means that an angle between the flow direction of the fluid on upstream of a position or a small region as a boundary and that on downstream of the same is an acute angle. The small region is a region having a length of one fifth or less of the entire length of the fluid path 13 in each fluid path 13. The small region is preferably a region having a length of one eighth or less of the entire length of the fluid path 13 in each fluid path 13.

Here, as a comparative example of this embodiment, a case is considered where extending directions of the fluid paths 13 are only directions along the rotation direction RD of the fluid flow generator 2. In this case, the fluid path having the inlet 131 in the fourth region R4 is considered to cause bad fluid flow because the distance to the outlet 132 disposed in the first region R1 is increased. In other words, the fluid flowing in this fluid path is considered to have lower contribution to cooling effect.

In contrast, with the structure of this embodiment, at least one of the fluid paths 13 having the inlet 131 in the fourth region R4 are formed so as to change the fluid flow direction at an acute angle. Therefore, in at least one of the fluid paths 13 having the inlet 131 in the fourth region R4, the distance to the outlet 132 can be decreased so that good fluid flow can be obtained. In other words, with this structure, the fluid flowing in the fluid path 13 having the inlet 131 in the fourth region R4 can contribute more to the cooling effect. In addition, with this structure, the fluid paths 13 can be formed in a large area of the fourth region R4 that can be a dead space in a conventional structure, and the area for the fluid to flow can be increased so that cooling efficiency can be improved. In addition, in this structure, the fluid flow direction changes at an acute angle on downstream of the inlet 131, and the fluid flow direction can be changed more efficiently than the structure in which the fluid flow direction is changed rapidly at the inlet of the path.

(2-2. Main Path and Sub-Path)

Figure 6:
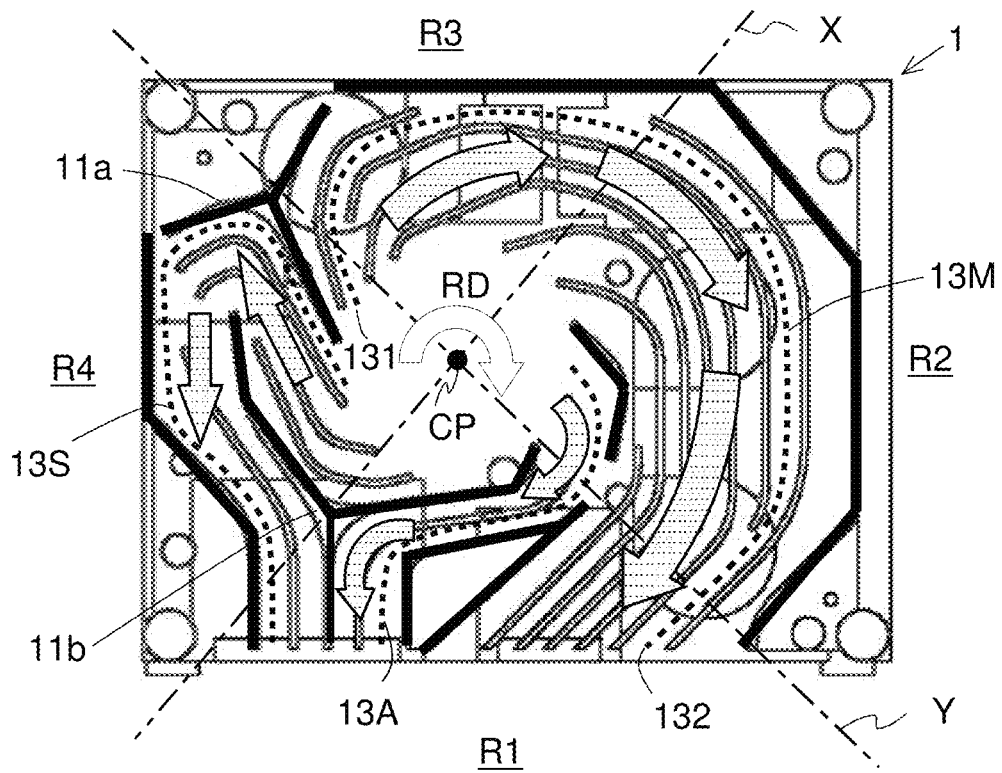
FIG. 6 is a diagram for describing a main path and a sub-path of the heatsink according to the embodiment of the present invention.

FIG. 6 is a diagram for describing a main path 13M and a sub-path 13S of the heatsink 1 according to the embodiment of the present invention. Similarly to FIG. 5, FIG. 6 is a plan view of the heatsink 1 viewed from above. In FIG. 6, thick solid lines are added for roughly grasping types of the fluid paths 13, and they are not necessarily intended to be boundary lines for separating types of the fluid paths 13. In addition, the main path 13M, the sub-path 13S, and an auxiliary path 13A shown by thick broken lines in FIG. 6 are merely examples of a plurality of the paths.

At least some of the plurality of fluid paths 13 formed in the top surface 10a of the main body section 10 are classified into the main paths 13M and the sub-paths 13S. In this embodiment, some of the plurality of fluid paths 13 are classified into the main paths 13M and the sub-paths 13S. Specifically, the plurality of fluid paths 13 are classified into the main paths 13M, the sub-paths 13S, and the auxiliary paths 13A.

The main path 13M is the fluid path 13 in which the fluid flows in the same direction as the rotation direction RD of the fluid flow generator 2. That the fluid flows in the same direction as the rotation direction RD means that, with respect to an imaginary line connecting the central axis C and a noted point in the fluid path 13 in a plan view from above, the fluid flowing at the noted point flows with an inclination in the same direction as the rotation direction RD of the fluid flow generator 2. In the main path 13M, the fluid flows in the same direction as the rotation direction RD of the fluid flow generator 2 in the entire range or in a substantially entire range. For instance, when the fluid flow direction is changed for adjusting the fluid discharge direction near the outlet 132, it may be a substantially entire range. In this embodiment, in the main path 13M, the fluid flows in the same direction as the rotation direction RD of the fluid flow generator 2 in the entire range.

In this embodiment, the main path 13M is the fluid path 13 that has the inlet 131 in the fourth region R4, the third region R3, or the second region R2, and has the outlet 132 that is one of the first outlet 132a, the second outlet 132b, the third outlet 132c, the fourth outlet 132d, the fifth outlet 132e, the sixth outlet 132f, and the seventh outlet 132g (see FIG. 5).

As a preferred configuration, in this embodiment, the main paths 13M include at least one of the fluid paths 13 having the inlet 131 in the third region R3. Specifically, the main paths 13M include a plurality of the fluid paths 13 having the inlet 131, that is the seventh inlet 131g, the eighth inlet 131h, or the ninth inlet 131i, disposed in the third region R3 at least partially. In this way, by means of the main paths 13M, it is possible to cool the large area including not only the first region R1 and the second region R2 but also the third region R3.

The sub-path 13S is the fluid path 13 having a part where the fluid flow direction is switched at an acute angle from the rotation direction of the fluid flow generator 2 to the opposite direction. That the fluid flows in the opposite direction to the rotation direction RD means that, with respect to the imaginary line connecting the central axis C and a noted point in the fluid path 13 in a plan view from above, the fluid flowing at the noted point flows with an inclination in the opposite direction to the rotation direction RD of the fluid flow generator 2. The part where the fluid flow direction is switched at an acute angle is located downstream of the inlet 131. The part where the fluid flow direction is switched at an acute angle is a position or a small region in the fluid path 13.

In this embodiment, the sub-path 13S is the fluid path 13 having the inlet 131 in the fourth region R4 or the first region R1 and the outlet 132 that is the tenth outlet 132j or the eleventh outlet 132k (see FIG. 5). With this structure, using the main path 13M, a large area of the heatsink 1 can be cooled. Further, disposing the sub-path 13S in the area where the main path 13M is hardly disposed in the heatsink 1, a larger area of the heatsink 1 can be cooled.

As a preferred configuration, in this embodiment, the sub-paths 13S include at least one of the fluid paths 13 having the inlet 131 in the first region R1, in addition to at least one of the fluid paths 13 having the inlet 131 in the fourth region R4. Specifically, the sub-paths 13S include a plurality of the fluid paths 13 having the inlet 131 that is the third inlet 131c or the fourth inlet 131d located in the fourth region R4 (see FIG. 5). In addition, the sub-paths 13S include a plurality of the fluid paths 13 having the inlet 131 that is the first inlet 131a or the second inlet 131b located in the first region R1 (see FIG. 5). With this structure, it is possible to send the fluid to the fourth region R4 also from the first region R1, and hence the fourth region R4 can be efficiently cooled though it can hardly be cooled by the main path 13M.

The auxiliary path 13A is the fluid path 13 having a part where the fluid flow direction is switched from the rotation direction RD of the fluid flow generator 2 to the opposite direction. However, in the auxiliary path 13A, the fluid flow direction is not switched at an acute angle. In other words, the auxiliary path 13A is different from the main path 13M or the sub-path 13S. The part where the fluid flow direction is switched from the rotation direction RD to the opposite direction is located downstream of the inlet 131.

In this embodiment, the auxiliary path 13A is the fluid path 13 having the inlet 131 in the second region R2 and the outlet 132 that is the eighth outlet 132h or the ninth outlet 132i (see FIG. 5). Note that the auxiliary path 13A may not be disposed. However, by disposing the auxiliary path 13A, a large area of the heatsink 1 can be cooled.

As described above, in this embodiment, there is the Y-shaped fin 11b disposed over the first region R1 and the fourth region R4. The Y-shaped fin 11b includes a part extending linearly to the outlet 132 in the first region R1. As the Y-shaped fin 11b is disposed, the sub-path 13S can be formed differently from other type of path. In this embodiment, the other type of path is the auxiliary path 13A. Note that if it is not necessary to be completely different from other type of path, a V-shaped fin may be disposed instead of the Y-shaped fin 11b. If the Y-shaped fin 11b in this embodiment is replaced with the V-shaped fin, a part of the sub-path 13S and a part of the auxiliary path 13A are merged.

Further in this embodiment, in the Y-shaped fin 11b disposed over the first region R1 and the fourth region R4, the part extending linearly to the outlet 132 is disposed biased to the fourth region R4 from the center in the arrangement direction of the plurality of outlets 132. However, this disposition may be modified. For instance, the part extending linearly to the outlet 132 may be disposed at the center in the arrangement direction of the plurality of outlets 132. In this case, the auxiliary path 13A may not be disposed.

(2-3. Details of Sub-Path)

Figure 7:
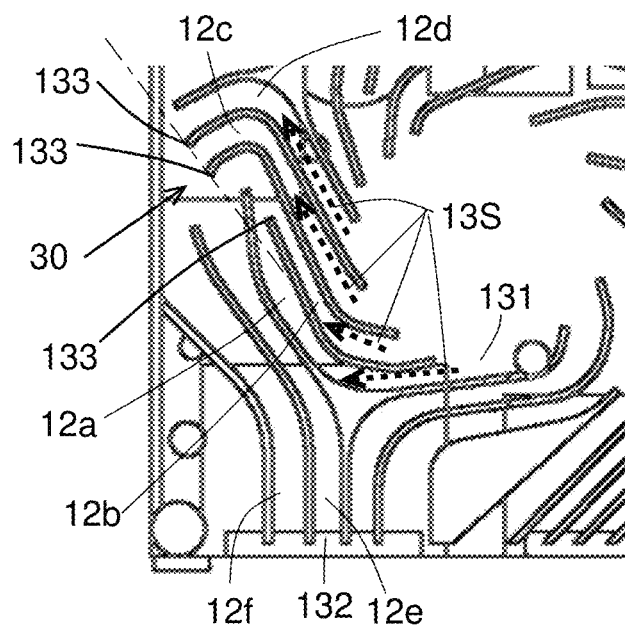
FIG. 7 is a diagram illustrating details of the sub-path according to the embodiment of the present invention.

FIG. 7 is a diagram illustrating details of the sub-path 13S according to the embodiment of the present invention. FIG.

7 is an enlarged view of a part of the heatsink 1 viewed from above. At least some of the plurality of sub-paths 13S have a sub-path joining section 133 for joining another sub-path 13S. In this embodiment, each of the plurality of sub-paths 13S has the sub-path joining section 133 for joining another sub-path 13S.

In each sub-path 13S, the sub-path joining section 133 is disposed downstream of the inlet 131. The sub-path joining section 133 is formed by breaking the fin 11 defining the flow passage 12 before reaching the outlet 132 from the inlet 131. In a plan view from above, the sub-path joining section 133 is an end on the downstream side of the fin 11 broken before reaching the outlet 132. In the sub-path joining section 133, the flow rate is increased because the fluids are collected from the plurality of fluid paths 13. Therefore, it is possible to prevent stagnation of fluid flow in the sub-path 13S having a part where the fluid flow is switched at an acute angle.

As illustrated in FIG. 7, in this embodiment, there is a joining region 30 where the fluids after passing through the sub-path joining sections 133 are collected. On upstream of the joining region 30, there are a first pre-joining flow passage 12a, a second pre-joining flow passage 12b, a third pre-joining flow passage 12c, and a fourth pre-joining flow passage 12d, in order in the rotation direction RD. On downstream of the joining region 30, there are a first post-joining flow passage 12e and a second post-joining flow passage 12f in order in the rotation direction RD. In other words, the number of the flow passages 12 after joining is decreased from that before joining. In this way, the flow rate becomes short so that stagnation of fluid flow can be prevented.

In addition, the first pre-joining flow passage 12a and the second pre-joining flow passage 12b join each other before they join the third pre-joining flow passage 12c and the fourth pre-joining flow passage 12d. In other words, the fluid flowing in the first pre-joining flow passage 12a joins the fluid flowing in the second pre-joining flow passage 12b, and afterward joins the fluids flowing in the third pre-joining flow passage 12c and the fourth pre-joining flow passage 12d. In addition, the fluid flowing in the second pre-joining flow passage 12b joins the fluid flowing in the first pre-joining flow passage 12a, and afterward joins the fluids flowing in the third pre-joining flow passage 12c and the fourth pre-joining flow passage 12d.

However, without limiting to this, the fluids flowing in the first pre-joining flow passage 12a, the second pre-joining flow passage 12b, the third pre-joining flow passage 12c, and the fourth pre-joining flow passage 12d may join at one time, for example. In this embodiment, the first pre-joining flow passage 12a has a step where the vertical direction height of the flow passage is increased from upstream to downstream. The step is formed due to a component disposed on the underside 10c of the main body section 10, for example. Because of this step, the fluid flow can be decreased in the first pre-joining flow passage 12a. In this embodiment, as the first pre-joining flow passage 12a and the second pre-joining flow passage 12b join each other earlier, the above-mentioned decrease in the fluid flow can be prevented.

(2-4. Details of Main Path)

Figure 8:
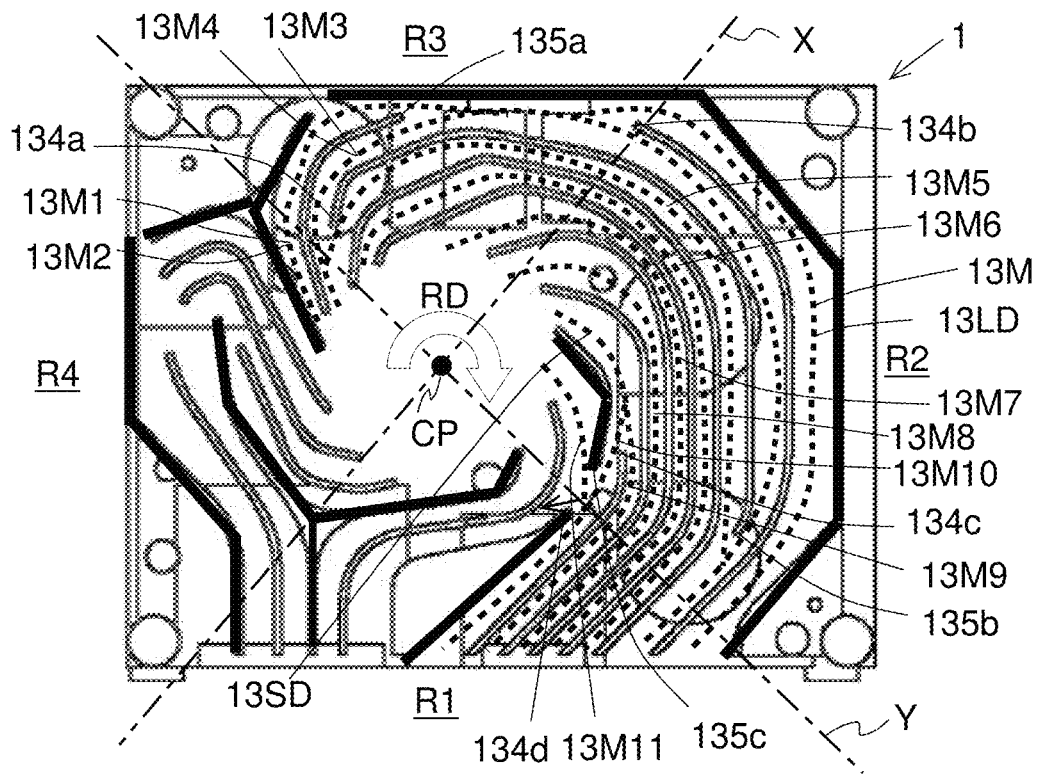
FIG. 8 is a diagram for describing a branch section and a joining section in the main path of the embodiment of the present invention.

FIG. 8 is a diagram for describing branch sections 134a to 134d and joining sections 135a to 135c in the main paths 13M of the embodiment of the present invention. FIG. 8 illustrates the heatsink 1 viewed from above. In FIG. 8, thick broken lines indicate the main paths 13M.

As illustrated in FIG. 8, the main paths 13M include a first main path 13M1, a second main path 13M2, a third main path 13M3, a fourth main path 13M4, a fifth main path 13M5, a sixth main path 13M6, a seventh main path 13M7, an eighth main path 13M8, a ninth main path 13M9, a tenth main path 13M10, and an eleventh main path 13M11.

The first main path 13M1 is the fluid path from the fifth inlet 131e to the first outlet 132a. The second main path 13M2 is the fluid path from the fifth inlet 131e to the second outlet 132b. The third main path 13M3 is the fluid path from the sixth inlet 131f to the first outlet 132a. The fourth main path 13M4 is one of the two fluid paths from the sixth inlet 131f to the second outlet 132b. The fifth main path 13M5 is the other of the two fluid paths from the sixth inlet 131f to the second outlet 132b. In a plan view from above, the fourth main path 13M4 is located outside of the fifth main path 13M5 with respect to the intersection CP. Note that details of the inlets 131 and the outlets 132 are illustrated in FIG. 5.

The sixth main path 13M6 is the fluid path from the seventh inlet 131g to the third outlet 132c. The seventh main path 13M7 is the fluid path from the eighth inlet 131h to the fourth outlet 132d. The eighth main path 13M8 is the fluid path from the ninth inlet 131i to the fifth outlet 132e. The ninth main path 13M9 is the fluid path from the tenth inlet 131j to the sixth outlet 132f. The tenth main path 13M10 is the fluid path from the tenth inlet 131j to the seventh outlet 132g. The eleventh main path 13M11 is the fluid path from the eleventh inlet 131k to the seventh outlet 132g. Note that details of the inlets 131 and the outlets 132 are illustrated in FIG. 5.

At least some of the plurality of main paths 13M have at least one of the branch section and the joining section. At the branch section, the fluid path 13 blanches into at least two. At the joining section, at least two fluid paths 13 join together. The branch section and the joining section are formed at ends of the fin 11 constituting the flow passage 12, in a plan view from above.

Figure 9:
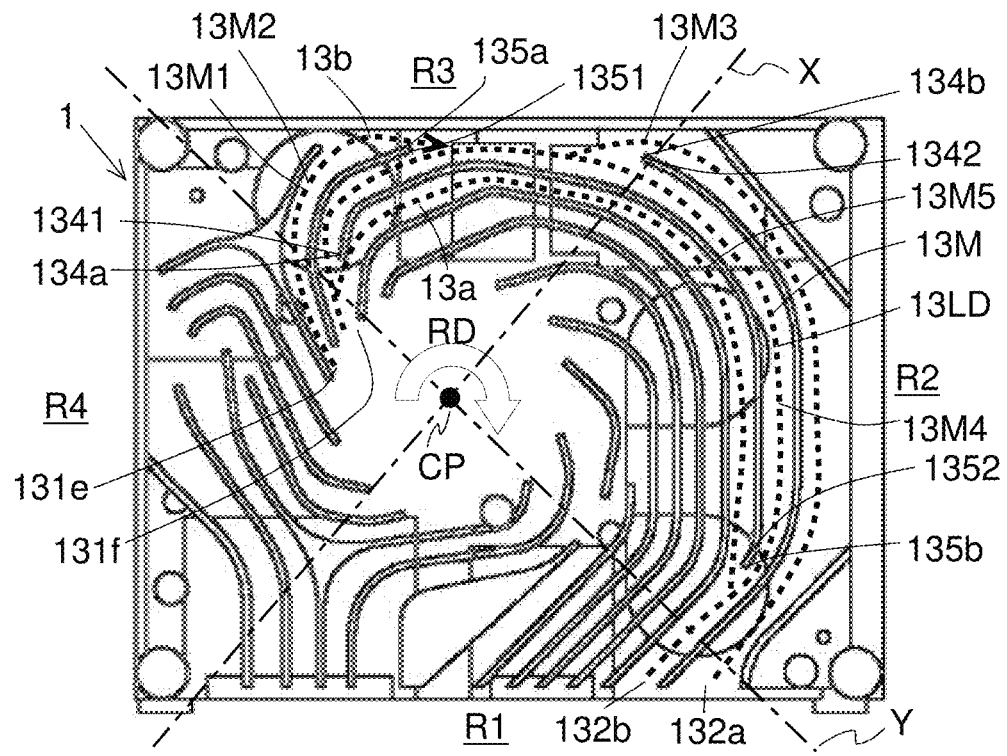
FIG. 9 is a diagram noting a third main path and a fourth main path illustrated in FIG. 8.
Figure 10:
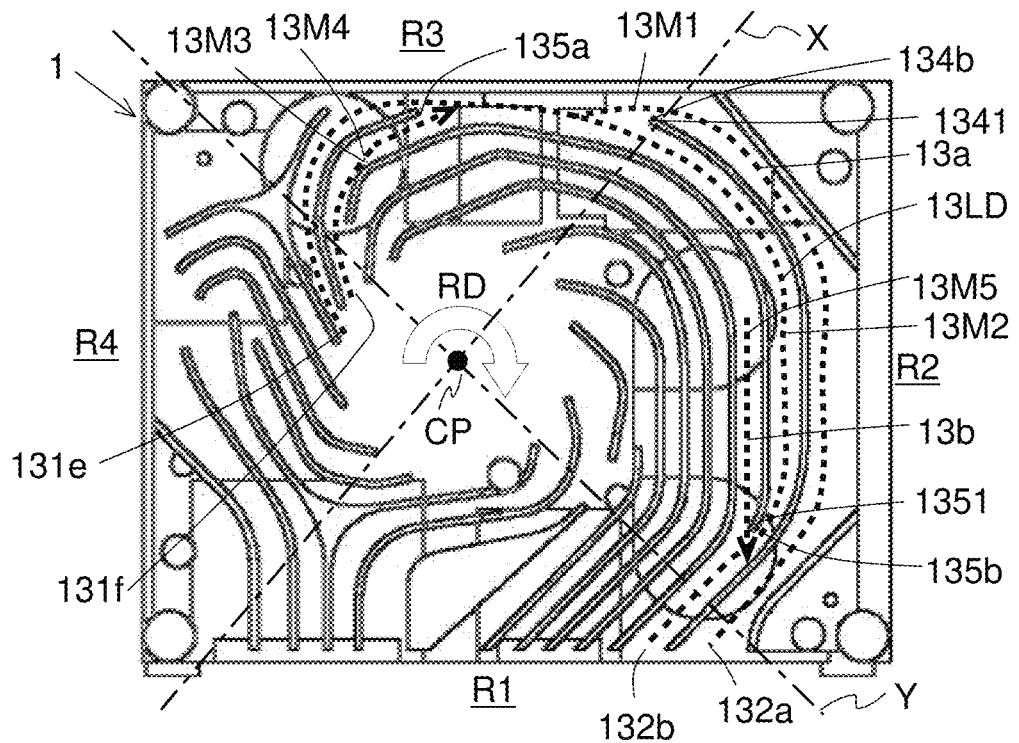
FIG. 10 is a diagram noting a first main path and a second main path illustrated in FIG. 8.
Figure 11:
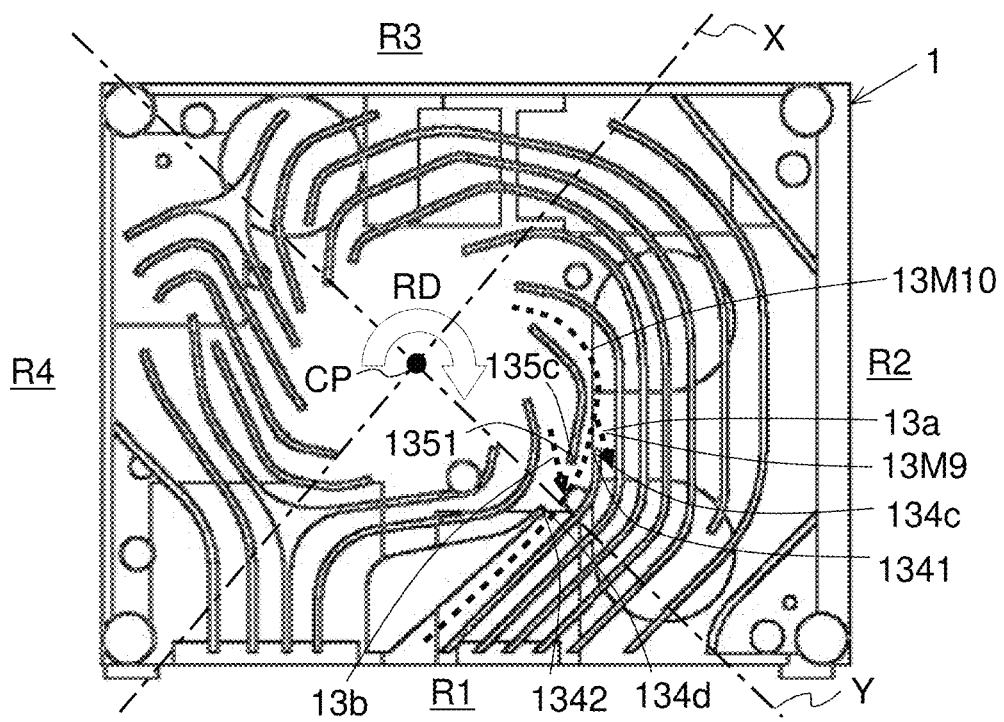
FIG. 11 is a diagram noting a tenth main path illustrated in FIG. 8.

As illustrated in FIG. 8, in this embodiment, some of the plurality of main paths 13M have at least one of the branch section 134a to 134d and the joining section 135a to 135c. With reference to FIGS. 9 to 11, details of the branch sections 134a to 134d and the joining sections 135a to 135c are described.

FIG. 9 is a diagram noting the third main path 13M3 and the fourth main path 13M4 illustrated in FIG. 8. As illustrated in FIG. 9, the third main path 13M3 has the two branch sections 134a and 134b and the one joining section 135a. The fourth main path 13M4 has the two branch sections 134a and 134b and the two joining sections 135a and 135b.

The third main path 13M3 and the fourth main path 13M4 have the branch section 134a for branching from the fifth main path 13M5 on downstream of the sixth inlet 131f. In other words, at least one of the plurality of fluid paths 13 has a first branch section 1341 for branching from the first fluid path 13a on downstream of the inlet 131. In the example illustrated in FIG. 9, the fifth main path 13M5 is the first fluid path 13a, and the number of the first fluid paths 13a is one. However, the number of the first fluid paths 13a may be plural. In addition, in the example illustrated in FIG. 9, the branch section 134a is the first branch section 1341.

The third main path 13M3 and the fourth main path 13M4 have the joining section 135a for joining the first main path 13M1 and the second main path 13M2 each having the fifth inlet 131e as the inlet 131, on downstream of the branch section 134a. In other words, at least one of the plurality of fluid paths 13 has a first joining section 1351 for joining the second fluid path 13b having another inlet 131, on downstream of the first branch section 1341. In the example illustrated in FIG. 9, the first main path 13M1 and the second main path 13M2 are the second fluid paths 13b, and the number of the second fluid paths 13b is two. However, the number of the second fluid paths 13b may be one or more than two. In addition, in the example illustrated in FIG. 9, the joining section 135a is the first joining section 1351.

According to this embodiment, the first branch section 1341 can increase the number of the flow passages 12 defined by the fins 11 so that cooling efficiency can be improved. According to this embodiment, while improving the cooling efficiency, the first joining section 1351 disposed on downstream of the first branch section 1341 can prevent stagnation of fluid flow due to the branching of the fluid path 13.

In addition, the third main path 13M3 and the fourth main path 13M4 further include the branch section 134b for branching the fluid path 13 on downstream of the joining section 135a. In other words, a part of the plurality of fluid paths 13 includes a second branch section 1342 for branching the fluid path 13 on downstream of the first joining section 1351. In the example illustrated in FIG. 9, the branch section 134b is the second branch section 1342. The second branch section 1342 branches the fluid path 13. Specifically, it is branched into the third main path 13M3 and the fourth main path 13M4. In this embodiment, the number of the second branch section 1342 is one, but it may be plural.

With this structure, by disposing the second branch section 1342 for branching the fluid path 13, the area in which the fluid flows can be increased. In this way, the cooling region of the heatsink 1 can be increased. However, the second branch section 1342 may not be disposed. In this case, for example, the first main path 13M1 and the third main path 13M3 may not be disposed.

In addition, the third main path 13M3 further includes, in addition to the joining section 135a, the joining section 135b for joining the fifth main path 13M5 that has branched at the branch section 134a. As described above, in the example illustrated in FIG. 9, the branch section 134a is the first branch section 1341, the joining section 135a is the first joining section 1351, and the fifth main path 13M5 is the first fluid path 13a. In other words, a part of the plurality of fluid paths 13 further includes, in addition to the first joining section 1351, the second joining section 1352 for joining the first fluid path 13a that has branched at the first branch section 1341. In the example illustrated in FIG. 9, the joining section 135b is the second joining section 1352. With this structure, the second joining section 1352 different from the first joining section 1351 can also prevent stagnation of fluid flow.

FIG. 10 is a diagram noting the first main path 13M1 and the second main path 13M2 illustrated in FIG. 8. As illustrated in FIG. 10, the first main path 13M1 includes the one branch section 134b and the one joining section 135a. The second main path 13M2 includes the one branch section 134b and the two joining sections 135a and 135b.

In details, the first main path 13M1 and the second main path 13M2 join the third main path 13M3 and the fourth main path 13M4 at the joining section 135a. The first main path 13M1 and the second main path 13M2 branch from each other at the branch section 134b. The second main path 13M2 joins the fifth main path 13M5 at the joining section 135b.

Here, the second main path 13M2 is noted. The second main path 13M2 has the branch section 134b for branching from the first main path 13M1 on downstream of the fifth inlet 131e. In other words, the branch section 134b can be regarded as the first branch section 1341 described above. The branch section 134b has functions as the first branch section 1341 and the second branch section 1342. Note that in the example illustrated in FIG. 10, the first main path 13M1 is the first fluid path 13a described above.

In addition, the second main path 13M2 includes the joining section 135b for joining the fifth main path 13M5 having the sixth inlet 131f as the inlet 131, on downstream of the branch section 134b working as the first branch section 1341. In other words, the joining section 135b can be regarded as the first joining section 1351. The joining section 135b has functions as the first joining section 1351 and the second joining section 1352. Note that in this case, the fifth main path 13M5 is the second fluid path 13b described above.

In this embodiment, at least one of the main paths 13M has the first branch section 1341 and the first joining section 1351. With this structure, even if a lot of the inlets 131 for the main paths 13M, in which the fluid path 13 tends to be long, cannot be disposed for limited space, for example, the area where the main paths 13M are disposed can be increased while preventing stagnation of fluid flow, by disposing the first branch section 1341 and the first joining section 1351. As a result, cooling efficiency of the heatsink 1 can be improved.

Note that the first branch section 1341 and the first joining section 1351 may be disposed in the sub-path 13S and the auxiliary path 13A.

Further in this embodiment, among the plurality of fluid paths 13, at least one of long distance paths 13LD, which pass through the third region R3 and the second region R2 between the inlet 131 and the outlet 132, has the first branch section 1341 and the first joining section 1351. Specifically, the long distance path 13LD is the fluid path 13 that passes at least the third region R3, the second region R2, and the first region R1. The long distance path 13LD may be the fluid path 13 that passes through the fourth region R4, the third region R3, the second region R2, and the first region R1.

In this embodiment, the second main path 13M2, the third main path 13M3, and the fourth main path 13M4 have the first branch section 1341 and the first joining section 1351. The second main path 13M2, the third main path 13M3, and the fourth main path 13M4 are long distance paths 13LD that pass through the fourth region R4, the third region R3, the second region R2, and the first region R1.

As to the fluid flowing in the rotation direction RD of the fluid flow generator 2, the distance from the inlet 131 to the outlet 132 becomes long in the long distance path 13LD, and hence the fluid flow tends to stagnate. Therefore, as conventional common sense, it is not easy to dispose the fin 11 in the middle of the fluid path 13 to form the branch section for the long distance path 13LD. However, in this embodiment, the first joining section 1351 is disposed for compensating stagnation of fluid flow that can be caused by disposing the first branch section 1341. Therefore, also for the long distance path 13LD, the fin 11 constituting the branch section can be disposed in the middle, and hence cooling efficiency can be improved.

Note that the first branch section 1341 and the first joining section 1351 may be disposed also in a short distance path 13SD that passes through only the second region R2 and the first region R1, or only the first region R1. FIG. 11 is a diagram noting the tenth main path 13M10 illustrated in FIG. 8. As illustrated in FIG. 11, in this embodiment, the tenth main path 13M10 as the short distance path 13SD has the first branch section 1341 and the first joining section 1351. Specifically, the branch section 134c is the first branch section 1341. The ninth main path 13M9 is the first fluid path 13a. The joining section 135c is the first joining section 1351. One of the fluid paths 13 having the eleventh inlet 134k (see FIG. 5) as the inlet is the second fluid path 13b. Note that the branch section 134d is the second branch section 1342 disposed on downstream of the first joining section 1351.

Further in this embodiment, as to the inlets 131 and the outlets 132 that are shared among the plurality of fluid paths 13, when the number is each counted as one, the number of the outlets 132 is the same as that of the inlets 131 for the long distance path 13LD. Specifically, the long distance path 13LD has the inlets 131 including the fifth inlet 131e, the sixth inlet 131f, the seventh inlet 131g, the eighth inlet 131h, and the ninth inlet 131i (see FIG. 5), and the number of the inlets 131 of the long distance path 13LD is five. The long distance path 13LD has the outlets 132 including the first outlet 132a, the second outlet 132b, the third outlet 132c, the fourth outlet 132d, and the fifth outlet 132e (see FIG. 5), and the number of the outlets 132 of the long distance path 13LD is also five. With this structure, in the long distance path 13LD, unnecessary increase of branching of the path is prevented, and stagnation of fluid flow can be prevented.

Further in this embodiment, at least one of the long distance paths 13LD has the inlet 131 in the fourth region R4. Specifically, the first main path 13M1, the second main path 13M2, the third main path 13M3, the fourth main path 13M4, and the fifth main path 13M5, which are some of the long distance paths 13LD, have the inlet 131 in the fourth region R4. In this way, the fourth region R4 can be used positively as a return path for the fluid, and hence cooling efficiency can be improved.

<3. Variation>

(3-1. First Variation)

Figure 12:
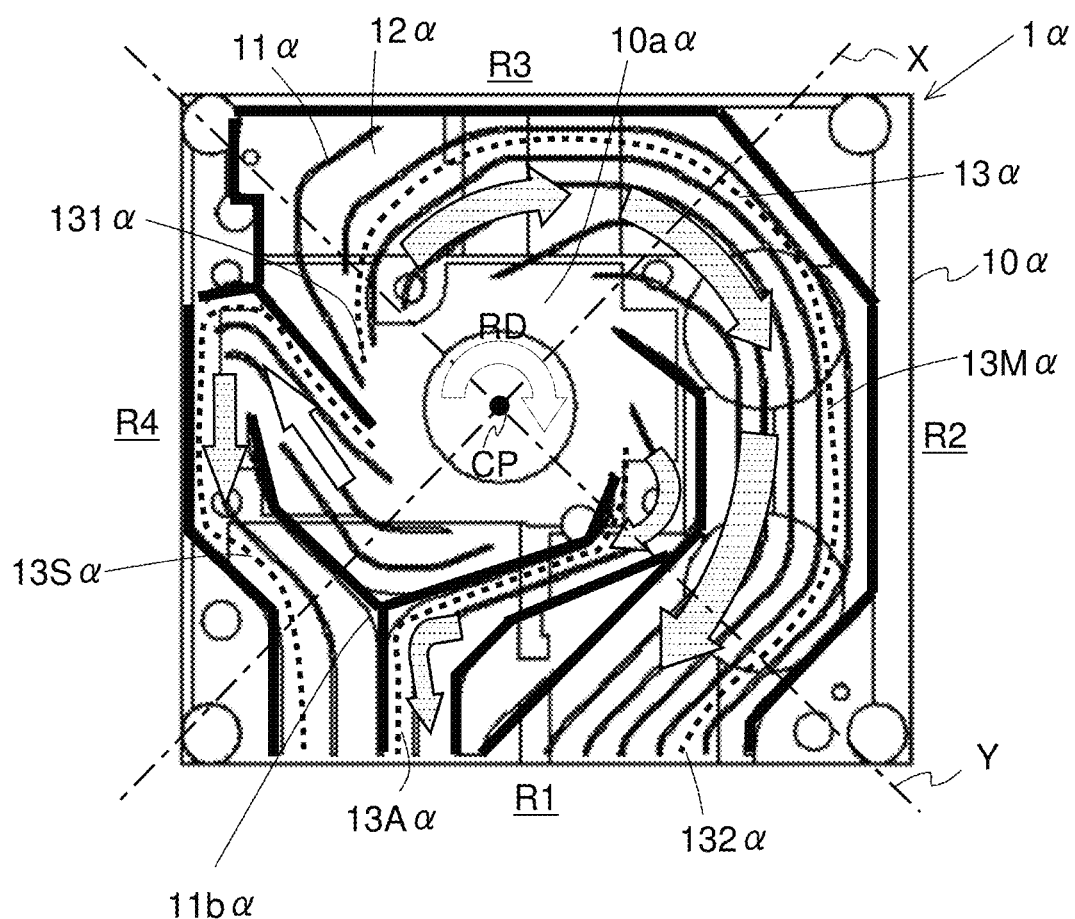
FIG. 12 is a plan view of the heatsink of a first variation.

FIG. 12 is a plan view of a heatsink 1α of a first variation. FIG. 12 illustrates the heatsink 1α viewed from above. Similarly to the embodiment described above, the heatsink 1α of the first variation also has fins 11α for defining a plurality of flow passages 12α on a top surface 10a α of a main body section 10α. A plurality of fluid paths 13α are obtained from the plurality of flow passages 12α. The plurality of fluid paths 13α are classified into main paths 13Mα, sub-paths 13Sα, and auxiliary paths 13Aα. A plurality of the main paths 13Mα, a plurality of the sub-paths 13Sα, and a plurality of the auxiliary paths 13Aα are disposed. Note that only some of the plurality of fluid paths are shown by thick lines in FIG. 12.

Also in the first variation, in the main paths 13Mα, the fluid flows in the same direction as the rotation direction RD of the fluid flow generator 2. The sub-path 13Sα has a part where the fluid flow direction is switched from the rotation direction RD of the fluid flow generator 2 to the opposite direction. In the heatsink 1α of the first variation, one Y-shaped fin 11bα is disposed, which is different from the embodiment described above. The Y-shaped fin 11bα disposed over the first region R1 and the fourth region R4 separates the sub-path 13Sα and the auxiliary path 13Aα.

Figure 13:
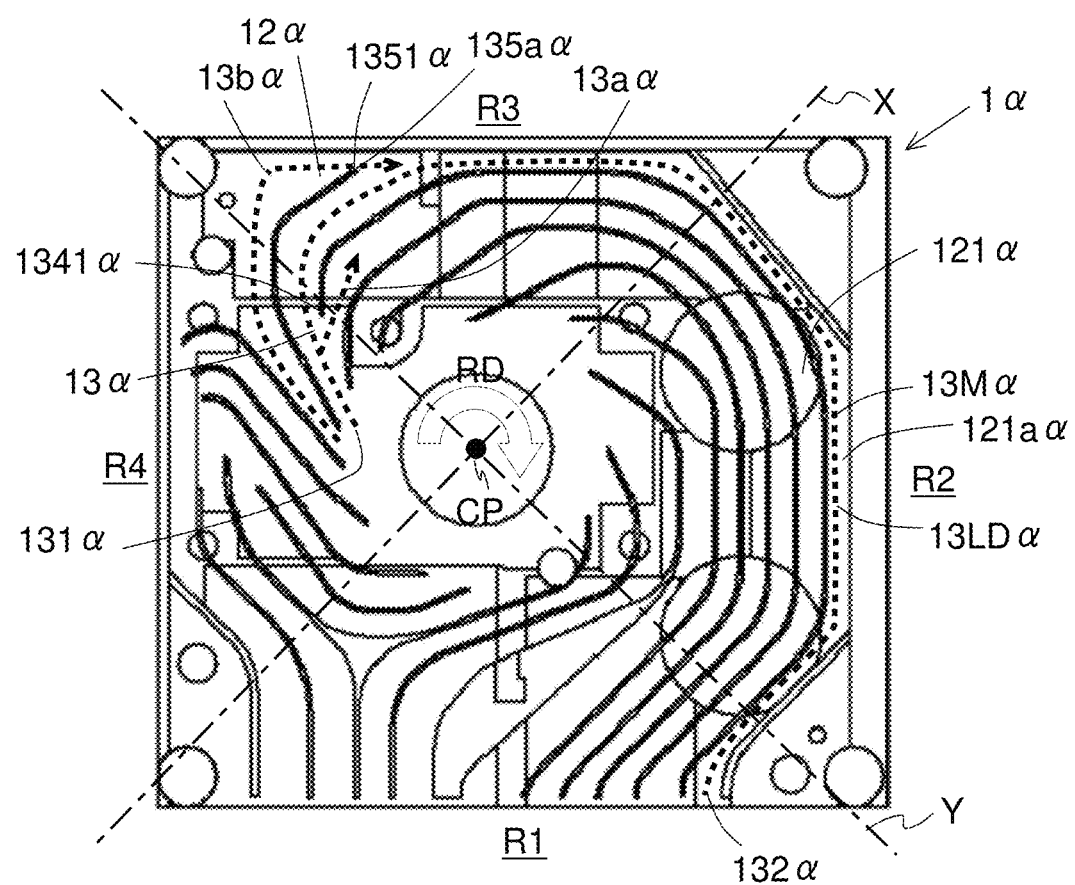
FIG. 13 is a diagram illustrating details of the main path in the heatsink of the first variation.

FIG. 13 is a diagram illustrating details of the main path 13Mα in the heatsink 1α of the first variation. As illustrated in FIG. 13, a part of the main paths 13Mα has a first branch section 1341α constituting a branching point with a first fluid path 13aα, and a first joining section 1351a constituting a joining point with a second fluid path 13bα on downstream of the first branch section 1341α.

Note that in the first variation, only one of long distance paths 13LDα passing through the fourth region R4, the third region R3, the second region R2, and the first region R1 has the first branch section 1341α and the first joining section 1351α. Further in the first variation, there is no main path 13Mα having a second branch section on downstream of the first joining section 1351α. Further in the first variation, there is no main path 13Mα having a second joining section for joining the first fluid path 13aα that has branched at the first branch section 1341α.

As to the inlets 131α and the outlets 132α that are shared among the plurality of fluid paths 13α, the number is each counted as one. In this case, in the long distance path 13LDα in the first variation, the number of the outlets 132α and that of the inlets 131α are the same six. Note that the long distance paths 13LDα are the fluid path 13α passing through all the four regions R1 to R4, and the fluid path 13α passing through the third region R3, the second region R2, and the first region R1.

In the first variation illustrated in FIG. 13, the long distance path 13LDα is constituted using a long distance flow passage 121α extending over the second region R2 and the third region R3. An upstream end of the long distance flow passage 121α may be positioned on a boundary between the third region R3 and the fourth region R4, or positioned in the fourth region R4, or positioned in the third region R3. A downstream end of the long distance flow passage 121α is positioned in the first region R1.

In a plan view from above, a plurality of the long distance flow passages 121α are arranged in a direction separating from the intersection CP. Among the plurality of long distance flow passages 121α, an outermost long distance flow passage 121aα positioned at the farthest position from the intersection CP in the second region R2 has a joining section 135aα for joining another flow passage 12α in at least one of the second region R2 and the third region R3. In this variation, in details, the outermost long distance flow passage 121aα has the joining section 135aα in the third region R3. As the joining section 135aα is disposed, stagnation of fluid flow can be prevented. Note that the similar joining section 135a (see FIG. 8) is disposed also in the embodiment described above.

(3-2. Second Variation)

Figure 14:
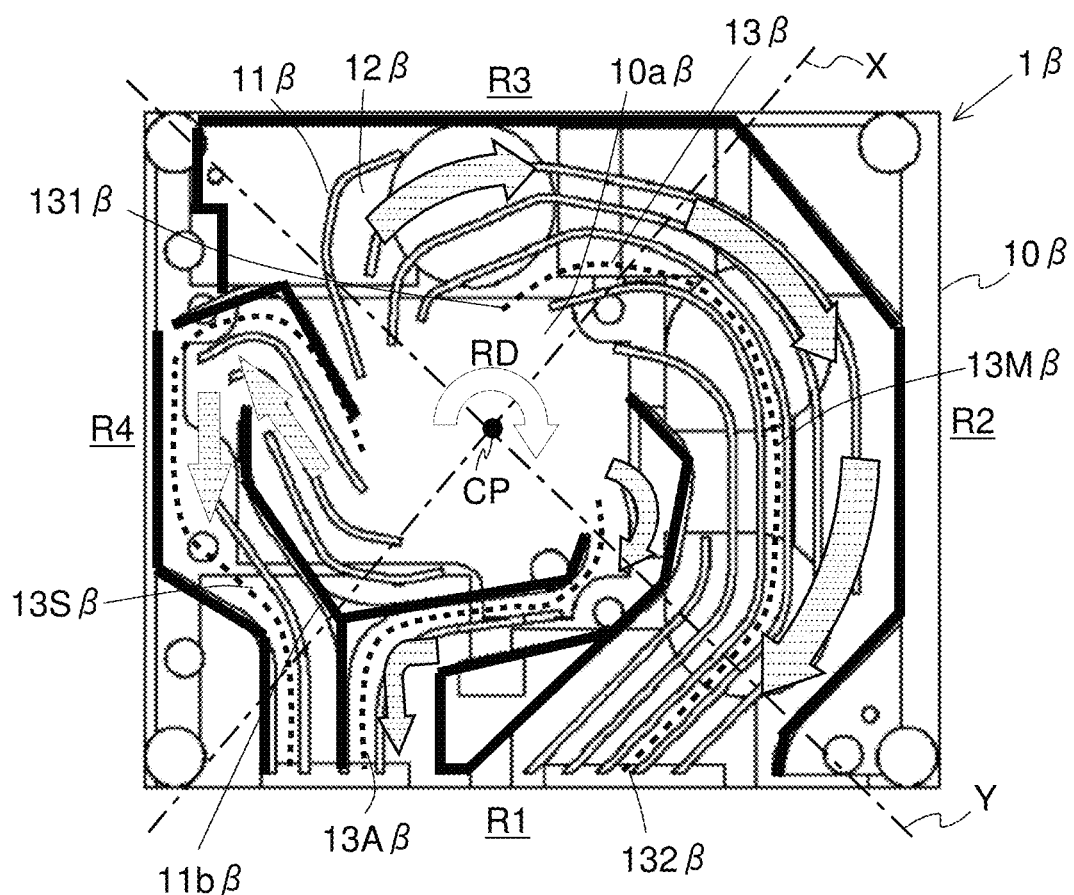
FIG. 14 is a plan view of the heatsink of a second variation.

FIG. 14 is a plan view of a heatsink 1β of a second variation. FIG. 14 illustrates the heatsink 1β viewed from above. Similarly to the embodiment described above, the heatsink 1β of the second variation also has fins 11β for defining a plurality of flow passages 12β on a top surface 10aβ of a main body section 10β. A plurality of fluid paths 13β are obtained from the plurality of flow passages 12β. The plurality of fluid paths 13β are classified into main paths 13Mβ, sub-paths 13Sβ, and auxiliary paths 13Aβ. A plurality of the main paths 13Mβ, a plurality of the sub-paths 13Sβ, and a plurality of the auxiliary paths 13Aβ are disposed. Note that only some of the plurality of fluid paths 13β are shown by thick lines in FIG. 14.

Also in the second variation, the fluid flows in the same direction as the rotation direction RD of the fluid flow generator 2 in the main path 13Mβ. The sub-path 13Sβ has a part where the fluid flow direction is switched from the rotation direction RD of the fluid flow generator 2 to the opposite direction. Also in the second variation, similarly to the first variation, there is one Y-shaped fin 11bβ for separating the sub-path 13Sβ and the auxiliary path 13Aβ.

Figure 15:
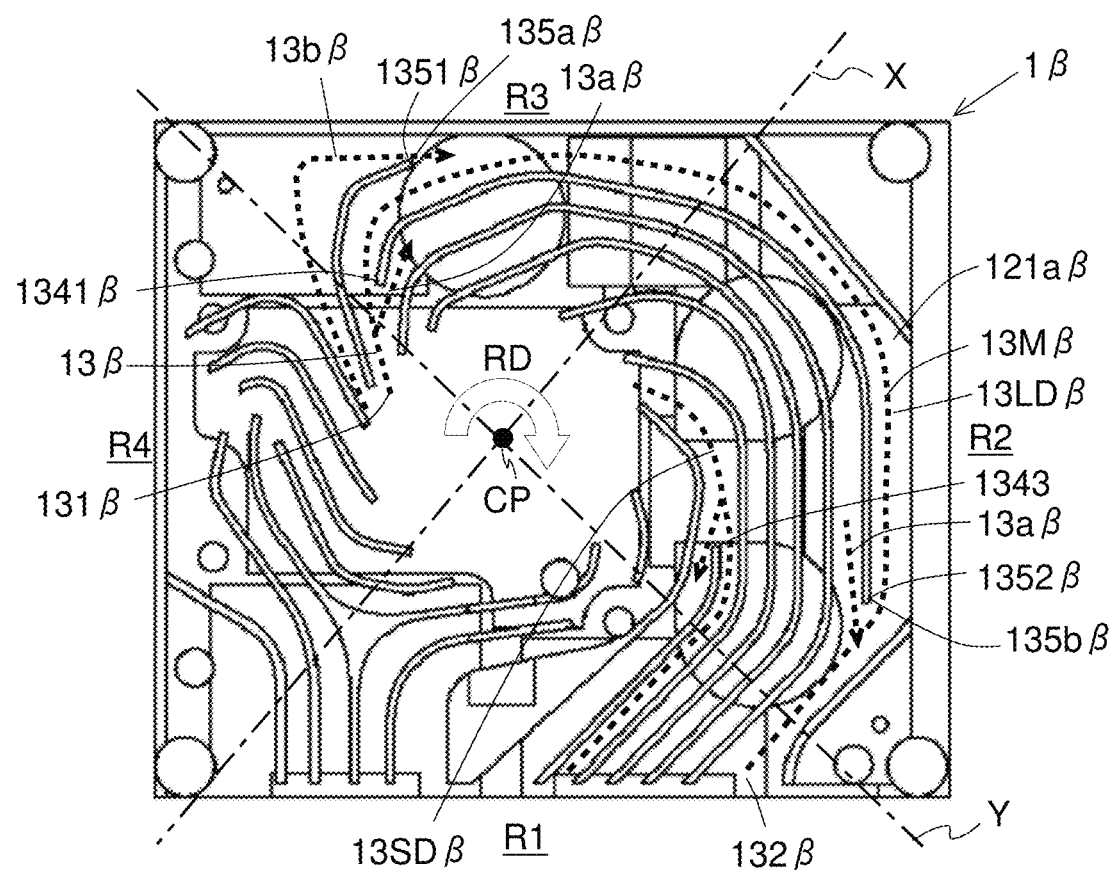
FIG. 15 is a diagram illustrating details of the main path in the heatsink of the second variation.

FIG. 15 is a diagram illustrating details of the main path 13Mβ in the heatsink 1β of the second variation. As illustrated in FIG. 15, a part of the main paths 13Mβ has a first branch section 1341β constituting a branching point with a first fluid path 134β, and a first joining section 1351β constituting a joining point with a second fluid path 13bβ on downstream of the first branch section 1341β.

Note that in the second variation, only one of long distance paths 13LDβ passing through the fourth region R4, the third region R3, the second region R2, and the first region R1 has the first branch section 1341β and the first joining section 1351β. In addition, in the second variation, there is no main path 13Mβ having a second branch section on downstream of the first joining section 1351β.

In the second variation, the main path 13Mβ having the first branch section 1341β and the first joining section 1351β has a second joining section 1352β for joining the first fluid path 134β that has branched at the first branch section 1341β. In the second variation, there is a main path 13Mβ having a third branch section 1343 for branching the fluid path 13. There is no joining section to be a joining point of the fluid before and after the third branch section 1343. The main path 13Mβ having the third branch section 1343 is a short distance path 13SDβ that passes through only the second region R2 and the first region R1. In the short distance path 13SDβ, it is easy to dispose the branch section without disposing the joining section, because fluid stagnation occurs less easily than the long distance path 13LDβ.

As to the inlet 131β and the outlet 132β shared among the plurality of fluid paths 13β, the number is each counted as one. In this case, in the second variation, the number of the outlets 132β is smaller than that of the inlets 131β in the long distance path 13LDβ. Specifically, the number of the outlets 132β is four, and the number of the inlets 131β is five. Therefore in the long distance path 13LDβ, unnecessary increase of branching of the fluid path 13β is prevented, and stagnation of fluid flow can be prevented.

Note that also in the second variation illustrated in FIG. 15, an outermost long distance flow passage 121aβ has joining sections 135aβ and 135bβ. Specifically, the outermost long distance flow passage 121aβ has the joining sections 135aβ and 135bβ for joining another flow passage in the second region R2 and the third region R3.

<4. Points to Consider>

Various technical features disclosed in this specification can be modified variously without deviating from the spirit of the technical creation. In addition, the plurality of embodiments and variations disclosed in this specification may be combined to the possible extent for implementation.

INDUSTRIAL APPLICABILITY

The present invention can be applied to cooling devices that are used for in-vehicle devices, home appliances, office machines, and the like, for example.

LIST OF REFERENCE SIGNS

1, 1α, 1β heatsink
2 fluid flow generator
10, 10α, 10β main body section
11, 11α, 11β fin
12, 12α, 12β flow passage
13, 13α, 13β fluid path
13a, 13aα, 13aβ first fluid path
13b, 13bα, 13bβ second fluid path
13LD, 13LDα, 13LDβ long distance path
13M, 13Mα, 13Mβ main path
13S, 13Sα, 13Sβ sub-path
100 cooling device
101 cooled body housing section
131, 131α, 131β inlet
132, 132α, 132β outlet
133 sub-path joining section
1341, 1341α, 1341β first branch section
1342 second branch section
1351, 1351α, 1351β first joining section
1352, 1352β second joining section
C central axis
CP intersection
R1 first region
R2 second region
R3 third region
R4 fourth region
RD rotation direction

The invention claimed is:

1. A heatsink to be used with a fluid flow generator that rotates about a central axis extending vertically to generate a flow of fluid, the heatsink comprising:
    a main body section having a top surface facing the fluid flow generator in a vertical direction; and
    fins that extend upward from the top surface so as to define a plurality of flow passages, wherein
        the top surface includes a flat region without the fins, the flat region facing the fluid flow generator,
        the fins are formed around the flat region,
        the plurality of flow passages form a plurality of fluid paths, each of which has an inlet for the fluid discharged from the fluid flow generator to flow in and an outlet for discharging to outside the fluid that has entered through the inlet,
        at least one of the plurality of fluid paths has a first branch section for branching from a first fluid path on downstream of the inlet and a first joining section for joining a second fluid path having another inlet, on downstream of the first branch section,
        four regions defined by an X axis and a Y axis, which cross each other at an intersection between the central axis and the top surface and extend in an extending direction of the top surface, are referred to as a first region, a second region, a third region, and a fourth region, in order in the opposite direction to a rotation direction of the fluid flow generator,
        in a plan view from above, the inlet of the plurality of fluid paths is disposed in at least one of the four regions, while the outlet of the plurality of fluid paths is disposed in the first region,
        among the plurality of fluid paths, the plurality of fluid paths includes a short distance path that passes through the second and first regions between the input and the output and a long distance path that passes through the third, second, and first regions between the input and the output, and
        the long distance path that pass through the third region and the second region between the inlet and the outlet has the first branch section and the first joining section.

2. The heatsink according to claim 1, wherein a part of the plurality of fluid paths further includes, in addition to the first joining section, a second joining section for joining the first fluid path that has branched at the first branch section.

3. The heatsink according to claim 1, wherein a part of the plurality of fluid paths further includes a second branch section for branching the fluid path on downstream of the first joining section.

4. The heatsink according to claim 1, wherein as to the inlets and the outlets that are shared among the plurality of fluid paths, when the number is each counted as one, the number of the outlets is the same as or smaller than that of the inlets for the long distance path.

5. The heatsink according to claim 1, wherein the long distance path has the inlet in the fourth region.

6. The heatsink according to claim 1, wherein the main body section has a cooled body housing section for housing a cooled body on its underside.

7. The heatsink according to claim 1, wherein the fluid flow generator discharges fluid in a direction perpendicular to a vertical direction.

8. A cooling device comprising the heatsink according to claim 1, and the fluid flow generator.

9. The cooling device according to claim 8, wherein the fluid is air, and the fluid flow generator is a centrifugal fan that intakes air from the top and discharges the air in a direction perpendicular to a vertical direction.

10. A heatsink to be used with a fluid flow generator that rotates about a central axis extending vertically to generate a flow of fluid, the heatsink comprising:
   a main body section having a top surface facing the fluid flow generator in a vertical direction; and
   fins that extend upward from the top surface so as to define a plurality of flow passages, wherein
      the plurality of flow passages form a plurality of fluid paths, each of which has an inlet for the fluid discharged from the fluid flow generator to flow in and an outlet for discharging to outside the fluid that has entered through the inlet, and
      at least one of the plurality of fluid paths has a first branch section for branching from a first fluid path on downstream of the inlet and a first joining section for joining a second fluid path having another inlet, on downstream of the first branch section,
      four regions defined by an X axis and a Y axis, which cross each other at an intersection between the central axis and the top surface and extend in an extending direction of the top surface, are referred to as a first region, a second region, a third region, and a fourth region, in order in the opposite direction to a rotation direction of the fluid flow generator,
      in a plan view from above, the inlet is disposed in at least one of the four regions, while the outlet is disposed in the first region, and at least some of the plurality of fluid paths are classified into main paths in which the fluid flows in the same direction as the rotation direction of the fluid flow generator, and sub-paths having a part where the fluid flow direction is switched at an acute angle from the rotation direction of the fluid flow generator to the opposite direction, and
      at least one of the main paths has the first branch section and the first joining section.

11. A heatsink to be used with a fluid flow generator that rotates about a central axis extending vertically to generate a flow of fluid, the heatsink comprising:
   a main body section having a top surface facing the fluid flow generator in a vertical direction; and
   fins that extend upward from the top surface so as to define a plurality of flow passages, wherein
      the top surface includes a flat region without the fins, the flat region facing the fluid flow generator,
      the fins are formed around the flat region,
      four regions defined by an X axis and a Y axis, which cross each other at an intersection between the central axis and the top surface and extend in an extending direction of the top surface, are referred to as a first region, a second region, a third region, and a fourth region, in order in the opposite direction to a rotation direction of the fluid flow generator,
      the plurality of flow passages form a plurality of fluid paths, each of which has an inlet for the fluid discharged from the fluid flow generator to flow in and an outlet disposed in the first region so as to discharge to outside the fluid that has entered through the inlet,
      the plurality of fluid paths includes
         a short distance path that passes through the second and the first regions between the input and the output and
         a long distance path that passes through the third, the second, and the first regions between the input and the output, and
      the long distance path is formed using a region-to-region extension flow passage extending over the third region and the second region,
      in a plan view from above, a plurality of the region-to-region extension flow passages are arranged in a direction separating from the intersection, and
      among the plurality of region-to-region flow passages, an outermost flow passage positioned at a farthest position from the intersection in the second region has a joining section for joining another flow passage in at least one of the second region and the third region.

* * * * *